United States Patent [19]

Brusati et al.

[11] Patent Number: 5,313,016
[45] Date of Patent: May 17, 1994

[54] AUTO-INSERTABLE ELECTROMAGNETIC INTERFERENCE GROUND CLIP

[75] Inventors: Peter V. Brusati, Hayward; Diane L. Boross, Belmont, both of Calif.

[73] Assignee: SynOptics Communications, Inc., Santa Clara, Calif.

[21] Appl. No.: 963,437

[22] Filed: Oct. 19, 1992

[51] Int. Cl.$^5$ .............................................. H05K 9/00
[52] U.S. Cl. ............................. 174/35 GC; 174/35 R; 361/816; 29/835; 29/838; 29/845
[58] Field of Search .......... 174/35 R, 35 MS, 35 GC; 361/424, 816, 817, 818; 439/92, 95, 96; 219/10.55 R, 10.55 D; 29/832, 835, 837, 838, 844, 845

[56] References Cited

U.S. PATENT DOCUMENTS

| | | |
|---|---|---|
| 4,370,515 | 1/1983 | Donaldson . |
| 4,503,484 | 3/1985 | Moxon . |
| 4,554,400 | 11/1985 | Schmalzl ...................... 174/35 GC |
| 4,571,012 | 2/1986 | Bassler et al. . |
| 4,640,979 | 2/1987 | Schmalzl ...................... 174/35 GC |
| 4,803,306 | 2/1989 | Malmquist . |
| 4,808,118 | 2/1989 | Wilson et al. . |
| 4,986,779 | 1/1991 | Ferril et al. . |
| 4,991,062 | 2/1991 | Nguyenngoc . |
| 5,020,866 | 6/1991 | McIlwraith . |
| 5,029,254 | 7/1991 | Stickney . |
| 5,043,528 | 8/1991 | Mohr . |
| 5,070,216 | 12/1991 | Thorton . |
| 5,072,070 | 12/1991 | Balsells . |
| 5,138,529 | 8/1992 | Colton et al. ........................ 361/424 |

Primary Examiner—Leo P. Picard
Assistant Examiner—Bot Ledinh
Attorney, Agent, or Firm—Blakely, Sokoloff, Taylor and Zafman

[57] ABSTRACT

An electromagnetic shielding clip for providing an electrical connection between two mating surfaces. The clip of the present invention comprises an electrically conductive sheet. The sheet is curved into a series of interconnected arc-shaped sections, each oriented opposite to the arc-shaped section adjacent to it. Two of the arc-shaped sections appear at opposite ends of the clip and are used to attach the clip to a mating surface through two parallel slots. Another arc-shaped section curves away from the parallel slots for contract to another mating surface. The present invention also includes a tool and method for inserting the clip.

11 Claims, 6 Drawing Sheets

RELAXED CONDITION

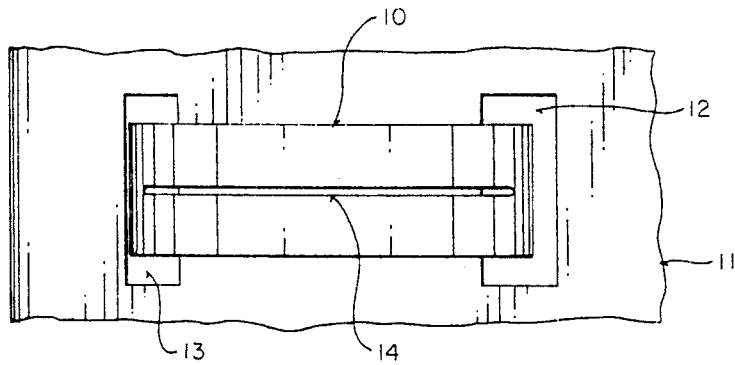
FIG. 1A (PRIOR ART)
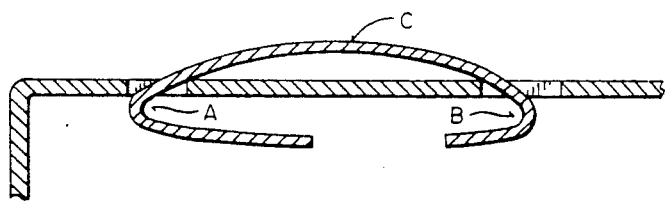
FIG. 1B (PRIOR ART)
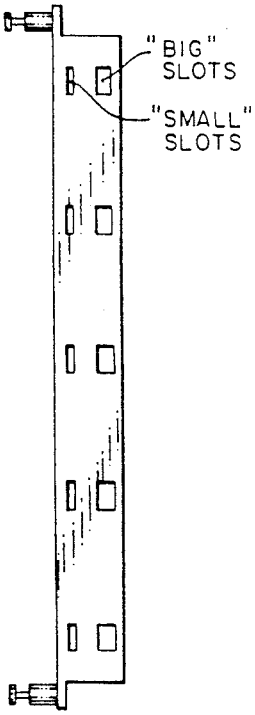
FIG. 2A (PRIOR ART)
FIG. 2B (PRIOR ART)
1. INSERT "BIG" END INTO "SMALL" SLOT
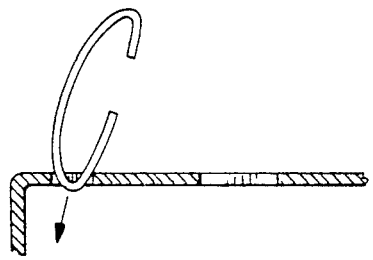
FIG. 2C (PRIOR ART)
2. PUSH CLIP AWAY FROM EDGE OF FLANGE UNTIL OTHER END OF CLIP SNAPS IN
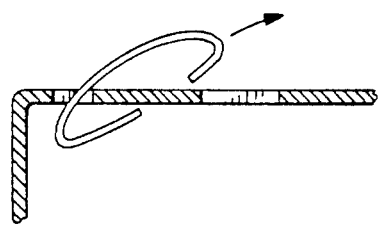
FIG. 2D (PRIOR ART)
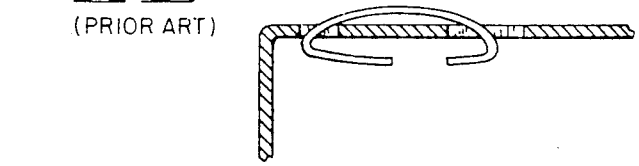

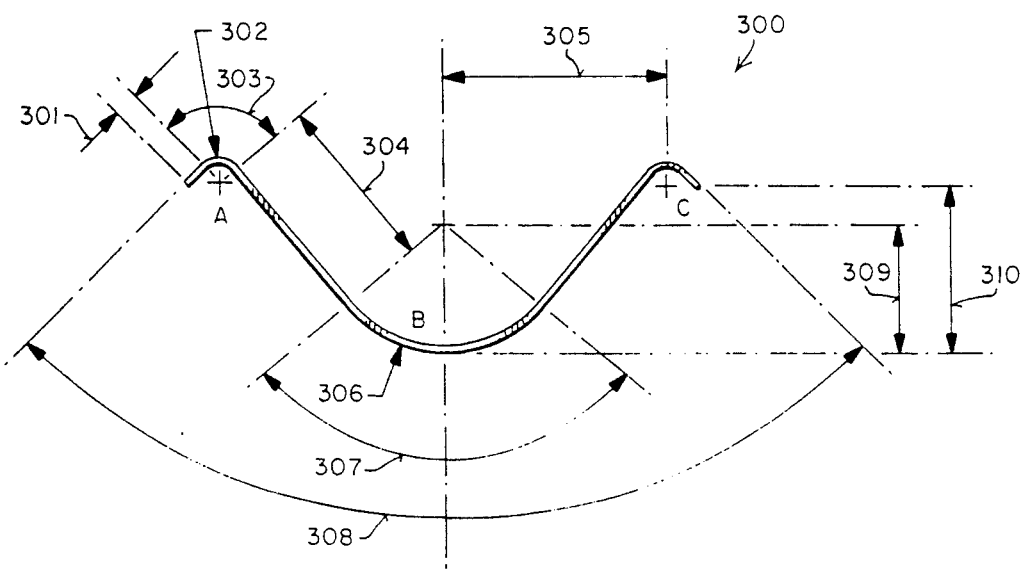
FIG_3A
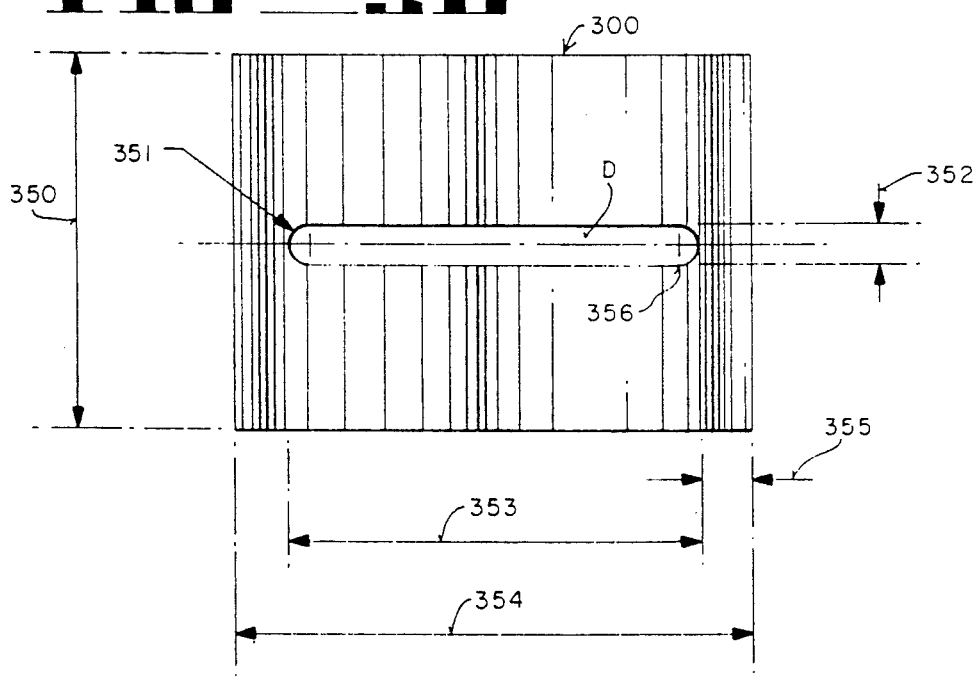
FIG_3B

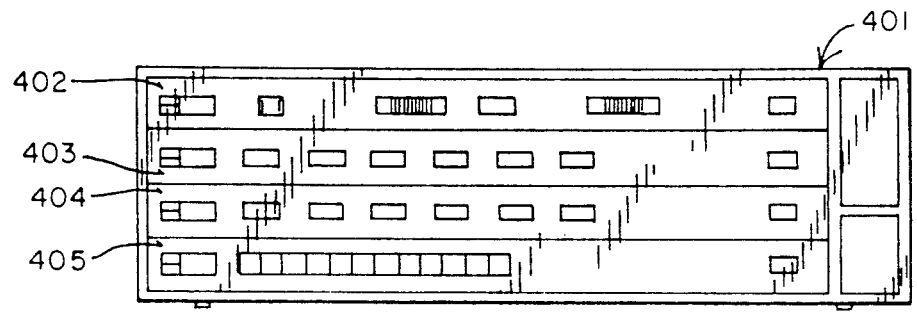
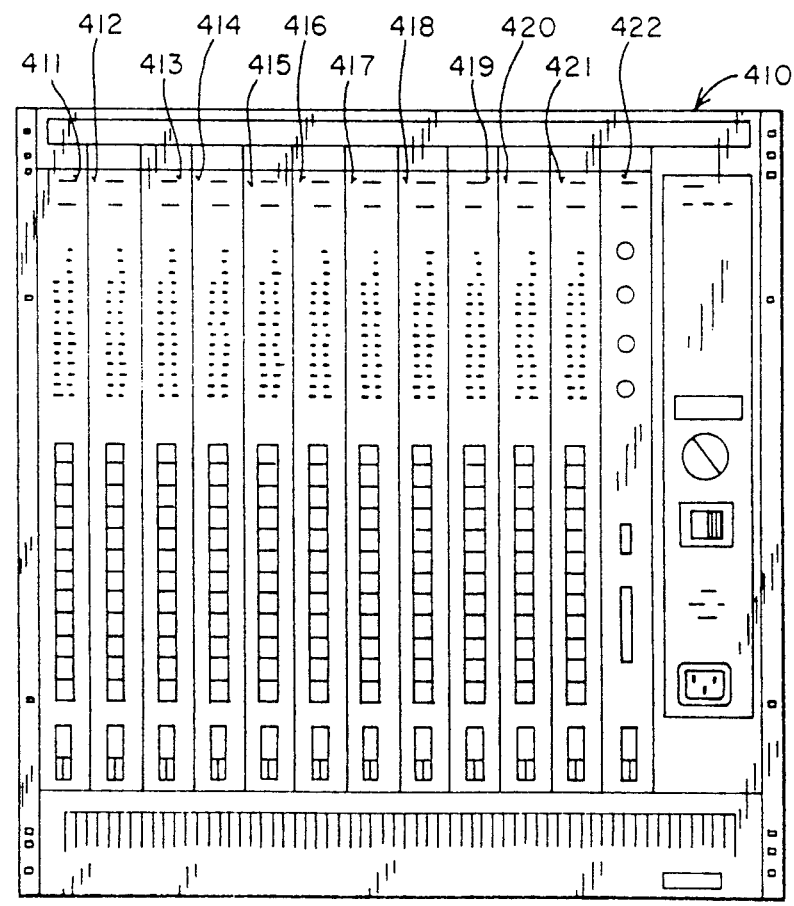

FIG _ 5
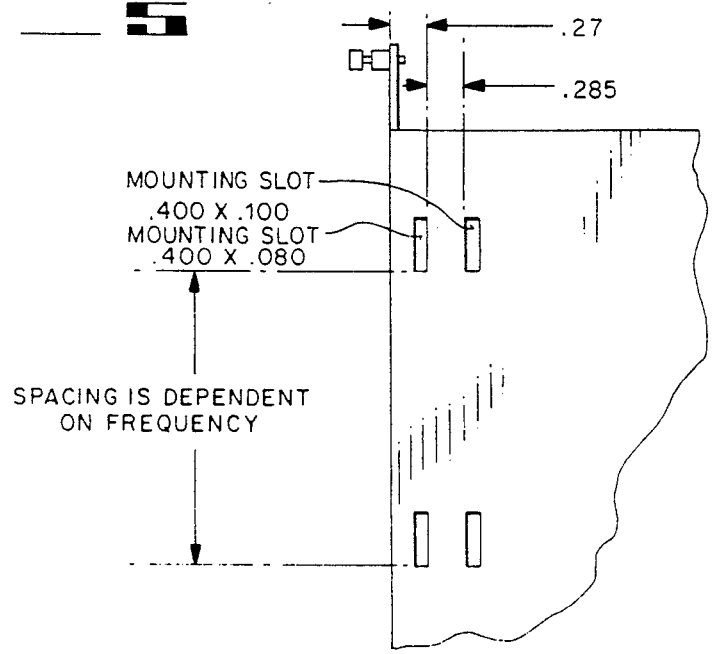
MOUNTING SLOT
.400 X .100
MOUNTING SLOT
.400 X .080
SPACING IS DEPENDENT ON FREQUENCY
FIG 7A
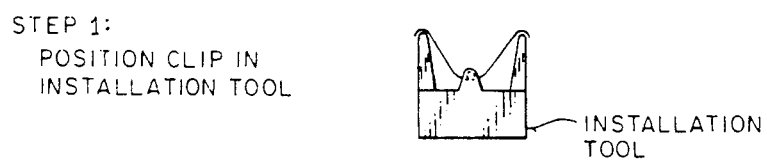
STEP 1:
POSITION CLIP IN INSTALLATION TOOL
INSTALLATION TOOL
FIG 7B
STEP 2:
INSTALL CLIP
FIG 7C
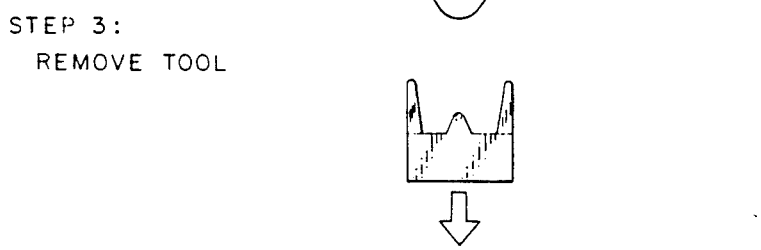
STEP 3:
REMOVE TOOL

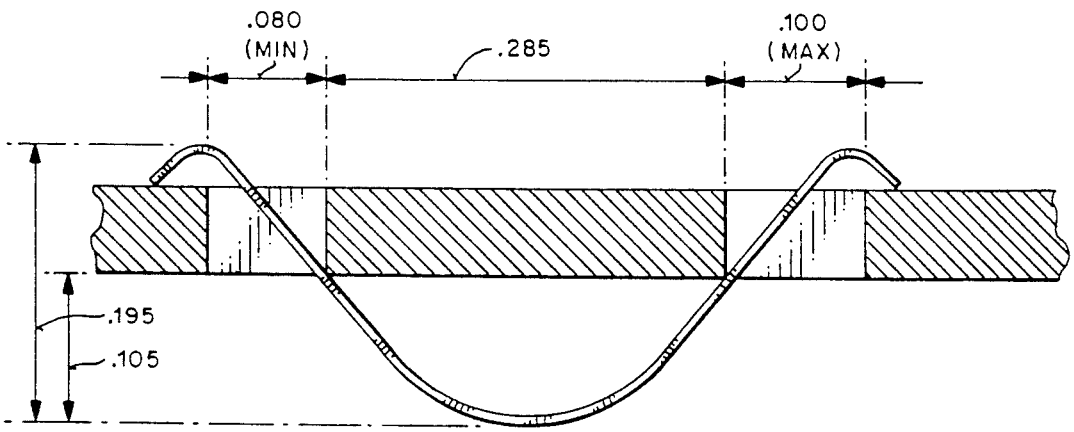
FIG_8A RELAXED CONDITION
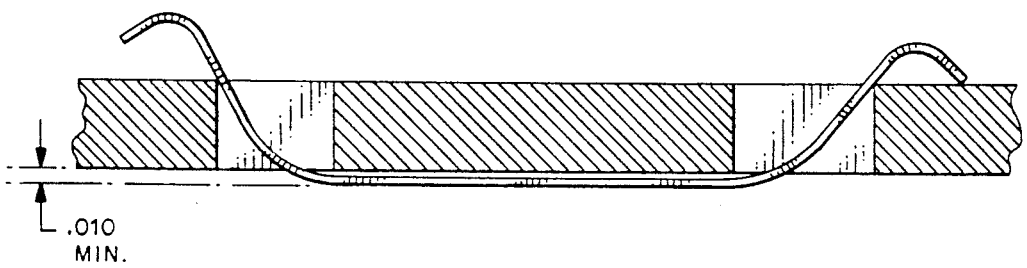
FIG_8B COMPRESSED CONDITION

AUTO-INSERTABLE ELECTROMAGNETIC INTERFERENCE GROUND CLIP

FIELD OF THE INVENTION

The present invention relates generally to the field of electromagnetic shielding devices; particularly, the present invention relates to electromagnetic shielding devices in the form of a clip.

BACKGROUND OF THE INVENTION

Electromagnetic interference (EMI) is a common problem in operating of electronic equipment. EMI is unwanted electromagnetic energy entering or emitting from a designated piece of equipment, thereby causing interference. EMI can cause electronic equipment to function improperly or to not function at all.

Typically, electronic equipment is housed within metallic cabinets which help reduce the EMI problems. These cabinets or structures generally have openings, such as doors or panels which are removable so that the electronic equipment may be serviced or replaced. Some gaps, openings or discontinuities between the cabinet frame and a door or panel allow the EMI to pass into or out of the cabinet, which can cause the failure of the electronic equipment in and around the cabinet.

One of the most widely used EMI shielding devices is a metal strip, commonly referred to as a finger stock. A finger stock is generally formed of beryllium copper or phosphor bronze and is shaped into a "V" or "U" having a number of resilient elements or "fingers" extending out from the center of the material and at least one of the arms. A finger stock is typically difficult to install (i.e., labor intensive) and requires a sufficient force be applied to it in order to achieve electrical continuity between the door or panel and the cabinet. Additionally, the finger stock is made of metal and is, thus, susceptible to fatigue. Repeated physical manipulation of a finger stock can cause the fingers to break off or be permanently compressed. In the case of either event, the shielding properties of the finger stock are substantially degraded or destroyed. A metal finger stock, therefore, requires routine and regular maintenance to oversee its condition, ultimately increasing its cost.

Alternatively, gaskets have been used to produce an electrically conductive contact. Particularly effective types of gaskets are known as spring finger strips. These spring fingers have a range of flexibility which permits them to adapt to unevenness mating surfaces. However, finger strips are limited by their compression range, which limits their maximum compression in order to prevent permanent deformation, or complete rupture, of the gasket. Thus, finger strips are not completely satisfactory. An additional disadvantage of known spring finger gaskets is if they are prone to damage due to snagging. Therefore, these materials have a very low elastic limit and can be permanently deformed under load.

One prior art EMI clip which avoids the snagging of the fingers or ends of the clip is shown in FIGS. 1A and 1B. Referring to FIGS. 1A and 1B, the top view and side view of the prior art clip are shown, respectively, with reference to a metal cabinet or structure to which it is attached. Referring to FIG. 1A, the top view of the prior art clip 10 is shown coupled to the mating surface 11 through slots 12 and 13. Clip 10 consists of a single sheet of conductive material. Each end of clip 10 is placed into a separate slot. Both ends of clip 10 are folded under the body of clip 10, such that the ends anchor clip 10 behind the wall of mating surface 11. Clip 10 has a slot 14. Slot 14 allows the clip to connect to uneven mating surfaces because the part of clip 10 on each side of slot 14 acts somewhat as a spring. Thus, slot 14 provides clip 10 with a dual spring nature, wherein one of the sides on each side of the slot can independently make contact to another mating surface.

FIG. 1B shows the side view of clip 10 in relation to the mating surface 11 and slots 12 and 13. Clip 10 is shown having three arcs A, B and C. Two of the arcs A and B bend the ends of the clip towards themselves. The end of clip 10 coupled to arc A is longer than the end of clip 10 coupled to arc B. Thus, FIGS. 1A and 1B show prior art clip 10 having protected ends to combat snagging. The other arc C in prior art clip 10 causes clip 10 to form a half elliptical side on its top portion, such that when the inner surface of the clip is resting on the flat surface at mating surface 11, the inner surface of clip 10 only makes contact with two parts of the flat mating surface. Thus, the remaining portion of clip 10 directly above the surface is arced away from the mating surface.

One of the problems with the prior art clip 10 of FIGS. 1A and 1B is the difficulty of its installation. Clip 10 is typically installed in a cabinet or card case having two parallel slots. The top view of such a cabinet is shown in FIG. 2A. It should be noted that one of the slots may be smaller than the other. The procedure for installing the prior art clip 10 is shown in FIGS. 2B–D. The first step of installing the clip is shown in FIG. 2B. Initially, the big end of clip 10 (i.e., the end having arc A) must be inserted into the small slot 12 in a downward motion as indicated by the arrow. Then, as shown in FIG. 2C, clip 10 must be pushed toward the edge of the flange (i.e., the direction of the arrow) until the other end of clip 10 snaps in. FIG. 2D shows how the clip should look once installation has been completed. It should be noted that the installation requires two separate steps, each requiring a movement in two distinct directions. Because this multi-directional installation of prior art clip 10 is so labor-intensive, it can be very costly and time consuming for a high volume process.

As will be shown, the EMI clip of the present invention allows a wide variation of gaps between adjacent sheet metal substrates. The EMI clip of the present invention holds up over repeated insertions and extractions by allowing for backward and forward sliding motion of an adjacent sheet metal substrate. The present invention also provides added durability by protecting the flexible exposed ends behind the supporting substrate panel (i.e., mating surface). Furthermore, the present invention includes a center slot and dual springs (or multiple slots and springs) to allow for successful grounding between uneven meeting surfaces. Moreover, the present invention provides a clip which is automatically insertable using a motion directed in a single direction.

SUMMARY OF THE INVENTION

It is an object of the invention to provide an EMI clip which has added durability.

It is another object of the invention to provide an EMI clip which does not snag.

It is yet another object of the invention to provide a clip which can be installed in a single directed motion.

A coupling medium for providing an electrical coupling between two mating surfaces is described. The coupling medium of the present invention comprises an electrically conductive portion that provides an electrical connection between first and second mating surfaces. The coupling medium also includes first and second anchoring portions which are at opposite ends of the electrically conductive portion. The first and second anchoring portions anchor the coupling medium to the first mating surface through slots in the mating surface. In one embodiment, the clip of the present invention is also resilient, such that any compression of the clip due to insertion of the clip into the parallel slots or due to compression between two mating surfaces does not permanently deform the clip.

The present invention also includes a method for inserting the clip. The method includes positioning the clip in an insertion tool and aligning the clip for direct insertion into the parallel slots of a mating surface. Then the tool is moved in a single direction, such that the arc-shaped end sections are pushed completely through the slots. The tool is then removed, wherein the end sections of the clip remain anchored behind the mating surface.

The present invention also includes a tool for inserting the clip. The tool includes two rod-like elements coupled together, such that an end of each element is separated a distance less than or equal to the distance between the arc-shaped end sections. The tool also includes a device for forcing the rod-like elements through the parallel slots, such that each end of the clip is pushed through the slots.

BRIEF DESCRIPTION OF DRAWINGS

The present invention will be understood more fully from the detailed description given below and from the accompanying drawings of the preferred embodiments of the invention, which, however, should not be taken to limit the invention to this specific embodiment, but are for explanation and understanding only.

FIGS. 1A and 1B illustrate the top and side views of a prior art EMI grounding clip.

FIG. 2A through 2D illustrate a prior art mating surface and the installation procedure for a prior art EMI grounding clip.

FIGS. 3A and 3B shows the currently preferred embodiment of the EMI grounding clip of the present invention.

FIGS. 4A and 4B illustrate examples of the prior art card cabinets or housings for which the present invention is utilized.

FIG. 5 illustrates one portion of a prior art card.

FIGS. 7A, 7B and 7C illustrate the installation procedure of the present invention.

FIGS. 8A and 8B illustrate a comparison between the relaxed and compressed condition of the EMI clip of the present invention.

DETAILED DESCRIPTION OF THE INVENTION

Figure 6A:
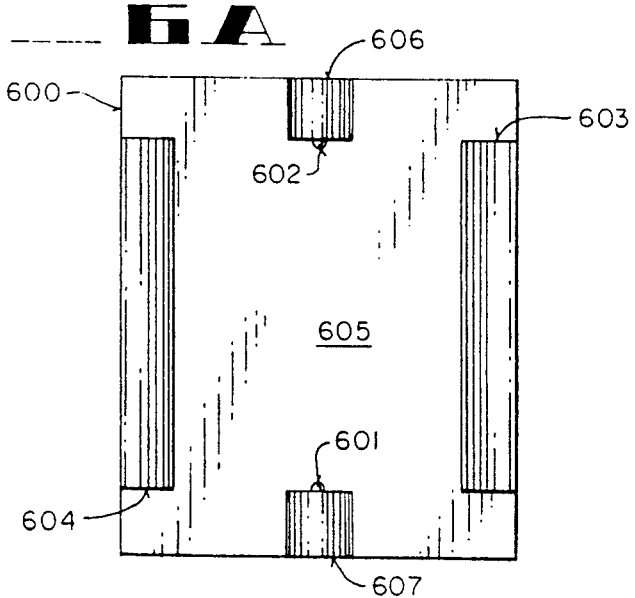
FIGS. 6A, 6B and 6C illustrate the tool used for installing the clip of the present invention according to the installation procedure of the present invention.

An electromagnetic interference (EMI) shielding clip for providing an electrical contact between two mating surfaces is described. In the following description, numerous specific details are set forth such as specific dimensions and material types, etc., in order to provide a thorough understanding of the preferred embodiment of the present invention. It will be understood to one skilled in the art that the present invention may be practiced without these specific details. Also, well-known formation and installation procedures have been shown in block diagram, rather than in detail, in order to avoid unnecessarily obscuring the present invention.

FIGS. 3A and 3B illustrate the EMI grounding clip 300 of the present invention. In the currently preferred embodiment, EMI clip 300 of the present invention comprises a single sheet of electrically conductive material. In the currently preferred embodiment, the sheet of conductive material is resilient. Therefore, clip 300 shown in FIGS. 3A and 3B is flexible such that if clip 300 is compressed towards or away from its access of symmetry (shown in FIG. 3A), clip 300 will return to its original shape and not be permanently physically deformed. The EMI clip of the currently preferred embodiment of the present invention is a single sheet of beryllium copper. It should be noted that other electrically conductive materials such as phosphor bronze, stainless steel, or any other suitable elastic, electrically conductive material may be used. The elastic nature of the clip bears on the thickness of the sheet. As long as the sheet is resilient, the thickness is acceptable. The thickness of the sheet of the present invention is between 0.0035 and 0.08 inches and is finished in a tin plate coating.

Referring to FIG. 3A, the sheet is bent such that clip 300 includes three arc-shaped sections A, B and C. In the currently preferred embodiment, the radius of arcs A and C as well as the size of each arc are the same and are designated by dimensions 302 and 303 respectively. In the currently preferred embodiment, the radius of curvature of arcs A and C is 0.025 inches and the arc of curvature of dimension 303 is 95°. The distance from the end of clip 300 to the beginning of arcs A and C is also the same length and is designated by dimension 301. In the currently preferred embodiment dimension 301 is 0.025 inches. It should be noted that the portions of clip 300 which comprise arcs A and C and the ends of clip 300 need only be the size necessary to allow clip 300 to be lodged behind the inner wall of the mating surface, as described later.

Clip 300 of the present invention includes segments of the sheet between arcs A and B and between arcs C and B. In the currently preferred embodiment, these segments are equal in length and are designated by dimension 304. In the currently preferred embodiment, dimension 304 is 0.179 inches. It should be noted that the present invention is not limited to having the distance between arcs A and B and arcs B and C be the same length.

Arc B has a radius of curvature designated by dimension 306 and an arc swing designated by dimension 307. In the currently preferred embodiment, dimension 306 is 0.13 inches and the arc of curvature of dimension 307 is 100°. In this configuration, the EMI clip of the present invention has an arc of curvature between the ends of the clip and it is designated as dimension 308. In the currently preferred embodiment, dimension 308 is 90°. As a reference, in the currently preferred embodiment, the horizontal distance between the locus of arc B and the loci of arcs A and C is 0.23 inches. Furthermore, as a reference in the currently preferred embodiment, the vertical distance between the loci of arches A and C to the endpoint of the sheet at arch B is 0.17 inches.

The dimensions of clip 300 of the present invention can be changed to suit the designs of the user. The dimensions required to create the clip of the present invention need only be those which allow two arc-shaped end sections to be pushed through two parallel slots where they are anchored to the inner surface of the mating sheet metal leaving the middle section of the clip arced away from the outer surface. Thus, the specific dimensions will depend on the width of both the parallel slots and the amount of distance between those slots. Moreover, even though the currently preferred embodiment is symmetrical about an axis of arc B, the clip of the present invention is not limited to a symmetrical configuration.

It should be noted that each of the arc sections of clip 300 could comprise multiple arcs coupled together such that the composite shape resembles that of an arc. In fact, it is possible that each of the arc sections in the clip of the present invention include portions which are flat and uncurved. Moreover, the end sections need not be arc-shaped. The shape of the end sections need only be able to be temporarily deformed when being pushed through the slots in a mating surface and expanding to their original position when finally through the mating surface, such that the end sections are anchored behind the mating surface.

Referring to FIG. 3B, the top view of the present invention is shown. The width of the sheet is shown as dimension 350. In the currently preferred embodiment the dimension 350 is 0.39 inches. The overall length of the sheet in its curved position is shown as dimension 354. In the currently preferred embodiment, dimension 354 is 0.53 inches. The present invention is shown with a slot D. The width of Slot D is designated by dimension 352. In the currently preferred embodiment dimension 352 is 0.04 inches and the slot is centered along the access of symmetry (i.e., the center line of the width of the sheet). The length of slot D is designated by dimension 353. In the currently preferred embodiment, dimension 353 is 0.42 inches. The slot is also centered on the other access of symmetry (i.e., the center of the length of the clip of the present invention). The ends of slot D are rounded having a radius designated by dimension 356. In the currently preferred embodiment, radius 356 is equal to 0.02 inches.

The center slot D shown in FIG. 3B allows for some independent action of both sections of clip 300 on either side of the slot. This independent action allows for each section on either side of slot D to make contact with the contacting mating surface somewhat independent of the other side. Thus, if the mating surface is uneven, both sides may make contact to uneven sides of the mating surface, such that on side of clip 300 may be more compressed than the other side. The center slot also allows clip 300 of the present invention to be aligned and registered during the installation procedure, as will be shown later. It should be noted that the number of slots used in clip 300 of the present invention may be varied according to the overall width of clip 300 and the likelihood of multiple uneven surfaces coming in contact with clip 300.

Moreover, due to the fact that the clip is not physically mounted and the ends of the clip are protected behind the mating surface, clip 300 of the present invention holds up to repeated insertions and extractions. The captive ends and arc-shaped curvature of the middle portion allow clip 300 to support the backward and forward motion of the adjacent sheet metal mating surface (i.e., the substrate for adjacent host modules).

FIGS. 4A and 4B show two examples of card cabinets or housings which hold cards having printed circuit boards. Referring to FIG. 4A, cabinet 401 is shown holding cards 402–405. Each of the cards is inserted into the housing which holds the card. Referring to FIG. 4B, cabinet 410 is shown holding cards 411–422. The cards and cabinets are those found commonly used in the art. It should be noted that there are many other types of card cabinets and housings configurations which may be used. The clip of the present invention may be coupled to either the cards or the cabinet itself to provide an electrical coupling between the neighboring component. For example, if the clip of the present invention is used on card 403, it may provide electrical coupling to card 404. Using a clip on each card permits an electrical coupling between all of the cards. If cabinet 401 or 410 had a clip for every card position, then any cards inserted into the cabinet would become electrically coupled to the cabinet.

FIG. 5 depicts the card cabinet 500 used in conjunction with the present invention. It should be noticed that the cabinet has multiple sets of mounting slots which are spaced according to the frequency of the EMI transmission. The size of the slots for use of the currently preferred embodiment are 0.08 and 0.10 inches wide. The thickness of the cabinet is approximately 0.06 inches and comprised of aluminum. FIG. 5 shows the mounting slots being 0.27 inches from the edge of the cabinet with the distance of 0.285 inches between slots. The present invention is not limited to these dimensions and the EMI clip of the present invention should be constructed such that both end sections can be anchored to the inside of cabinet 500 while leaving the middle portion of the clip arced away from the outer surface.

Figure 6B:
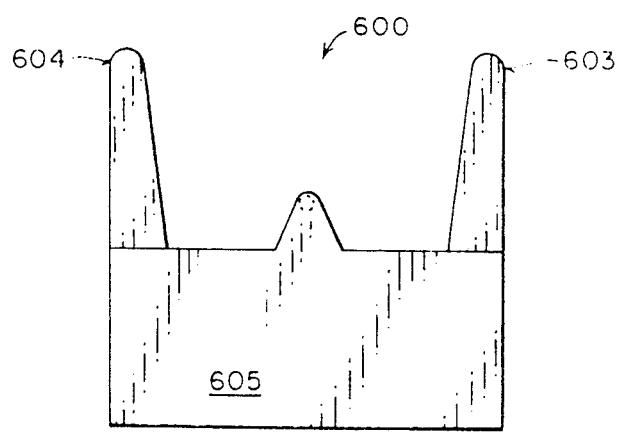
Figure 6C:
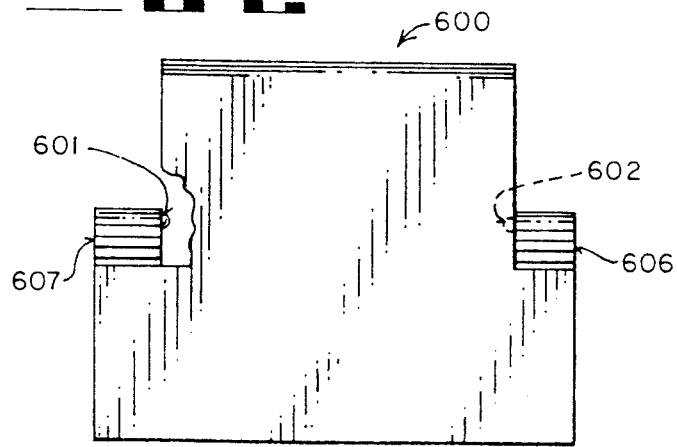

FIGS. 6A–6C illustrate the currently preferred embodiment of the tool used to install the EMI clip of the present invention. FIG. 6A depicts the overhead view of the installation tool 600. FIG. 6B depicts one side view of installation tool 600, while FIG. 6C depicts the other side view of installation tool 600. Referring to FIG. 6A, 6B and 6C, tool 600 comprises base 605 which is coupled to rod-like extensions 603 and 604. Tool 600 also includes clip retention bumps to hold the clip in place during installation. In the currently preferred embodiment, tool 600 has two clip retention bumps, 601 and 602. The clip retention bumps are positioned above base 605 using extensions 606 and 607. When the clip is positioned in tool 600, its centered arc shaped section becomes retained below clip retention bumps 601 and 602, while the arc-shaped sections at the ends of the clip are supported on top of extension rods 603 and 604. This locks the clip in place while installing the clip. Clip retention bumps 601 and 602 are such that when the clip is anchored behind the panel or cabinet wall, the clip is released.

FIGS. 7A to 7C shows the installation procedure of the currently preferred embodiment utilized to insert the EMI clip of the present invention. The installation procedure generally comprises three steps. First, the clip must be positioned in the installation tool. This could easily be done by positioning the clip in the tool or the clips could be supplied on continuous strips and automatically fed into the tool. Secondly, as shown in FIG. 7B, the clip of the present invention is centered over and inserted through the slots in the cabinet surface. The installation tool of FIGS. 6A–6C is used to insert the EMI clip through the slots. While the clip is being pushed through the slots, the resilient arc-shaped sections deform to allow the ends to proceed through the slots. Once the ends have cleared the inner surface of the mating surface (i.e., the card cabinet), the ends extend to their original shape positions and, thus, regain their original shape. The tool is then removed, thereby leaving the arc-shaped end sections of the EMI clip of the present invention anchored behind the inner surface of the cabinet wall, as shown in FIG. 7C. The EMI clip is insertable in a single motion. In other words, as shown in FIGS. 7A–7C, the motion required to insert the clip is only in one direction, as opposed to FIG. 2 which required moving the clip in multiple directions. In the present invention, if the card cabinet had been positioned below the clip, insertion would only require a single downward motion.

FIG. 8 shows a comparison between the relaxed condition of the currently preferred embodiment of the present invention and the compressed condition in relation to the card cabinet used to anchor the clip. The card cabinet used by the clip of the present invention is defined as having two slots, one being a minimum of 0.080 inches wide and the other being a maximum of 0.100 inches wide. The distance between the two slots is 0.285 inches. Referring to FIG. 8A, in the currently preferred embodiment, the clip once inserted shows approximately 0.105 inches above or outside the outer surface of the mating surface. Furthermore, the total height of the clip in the relaxed condition in the currently preferred embodiment is 0.195 inches. Referring to FIG. 8B shows the compressed condition of the chip. Note that in its compressed condition the clip can be as little as 0.01 inches away from the mating surface to which it is anchored.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, any reference to the details of the preferred embodiments are not intended to limit the scope of the claims which themselves recite only those features regarded as essential to the invention.

Thus, an EMI shielding clip for providing electrical conductivity between two mating surfaces and a tool and method for installing the EMI clip has been described.

We claim:

1. An electromagnetic shielding device comprising:
   a frame and panel structures having planar parts, wherein one of the panel structures includes two parallel slots; and
   a resilient electrically conductive sheet, wherein an electrical connection is created when said sheet is compressed between said one of the panel structures and a second mating surface without said sheet being permanently deformed,
   said sheet having curved portions comprising a series of arc-shaped sections interconnected, such that each of said arc-shaped sections is opposite to that of its adjacent arc-shaped section, wherein one of said arc-shaped sections is at each of the ends of said sheet for coupling said sheet behind said one of said panel structures containing two parallel slots, such that said arc-shaped sections at the ends of said sheet are received by said one of the panel structures, wherein the arc-shaped sections at the ends of said sheet are resilient, such that both of said ends are temporarily deformed when passing through said two parallel slots and are anchored behind said one of said panel structures after passing through said two parallel slots.

2. The device defined in claim 1 wherein one of said arc-shaped sections is located in the middle portion of said sheet, said one of said arc-shaped sections, said one of said arc-shaped sections having a plurality of slots being substantially perpendicular to said two parallel slots of said surface, such that an electrical connection is formed between said surfaces when said surfaces are uneven.

3. The device defined in claim 2 wherein one of said plurality of slots is located substantially in the center of said one of said arc-shaped sections for aligning said device during insertion into said two parallel slots.

4. The device defined in claim 3 wherein said series of arc-shaped sections comprises three arc-shaped sections.

5. An electromagnetic shielding device comprising:
   a frame and panel structures having planar parts, wherein one of the panel structures includes two parallel slots; and
   an electrically conductive sheet, said sheet being elastic such that said sheet is temporarily deformed when an electrical connection is created by compressing said sheet between said one of said panel structures and second mating surface and when said sheet is compressed for insertion into said two parallel slots,
   said sheet having curved portions consisting of a series of arc-shaped sections interconnected, such that each of said arc-shaped sections is opposite to that of its adjacent arc-shaped section and such that said device is symmetrical, wherein one of said arc-shaped sections is at each of the ends of said sheet for attaching said device to said one of said panel structures by said two parallel slots for receiving either of said one of said arc-shaped sections at the ends of said sheet in a single downward motion, wherein said arc-shaped sections at the ends of said sheet are resilient and temporarily deformed when passing through said parallel slots, such that both of said ends are anchored behind said one of said surfaces.

6. The device defined in claim 5 wherein one of said arc-shaped sections is located in the middle portion of said sheet, said one of said arc-shaped sections, said one of said arc-shaped sections having a plurality of slots being substantially perpendicular to said two parallel slots of said surface, such that an electrical connection is formed between said surfaces when said surfaces are uneven.

7. The device defined in claim 5 wherein the center portion of said sheet contains a slot for registration and alignment of said device in an insertion tool.

8. The device defined in claim 5 wherein said series of arc-shaped sections comprises three arc-shaped sections.

9. An electromagnetic shielding device comprising:
   a frame and panel structures having planar parts, wherein one of said panel structures has two apertures: and
   a curved sheet of resilient conductive material, said curved sheet having three arc-shaped sections, wherein said sheet is symmetrical, such that two of said sections are at opposite ends of said sheet and the other of said sections being in the middle of said sheet, said two sections being end sections and said other section being the middle section, said sections being coupled, such that each of said end sections are opposite to that of said middle section, wherein said end sections are anchored behind said one of said panel structures and coupled to said middle section through said two apertures, such that only said middle section is in direct contact with said one of said panel structures and a second mating surface when an electrical connection is created by compressing said sheet between said one of said panel structures and said second mating surface, wherein said end sections are resilient, such that the end section became compressed when passing through said two apertures to lock said sheet to said one of said panel structures, and wherein said middle section containing a slot, such that said middle section is divided into subsections, wherein each of said subsections is capable of forming an electrical connection between said surfaces, and further wherein said slot aligns is used to insert said end sections in a single downward motion.

10. A method for installing an EMI grounding clip into a mating surface having two parallel slots, said clip comprising a series of arc-shaped sections interconnected, such that each of said arc-shaped sections is opposite to that of its adjacent arc-shaped section, wherein one of said arc-shaped sections is at each of the ends of said sheet for attaching said device to one of said mating surface and another of said arc-shaped sections is in the middle of said clip, said two parallel slots for receiving either of said one of said arc-shaped sections at the ends of said sheet from the outer surface to said mating surface to its inner surface, said method comprising the steps of:

positioning the clip such that the end arc-shaped sections are aligned with the parallel slots; and inserting each of the arc-shaped end sections into said parallel slots, wherein said end sections are resilient and temporarily compressed when passing through said parallel slots, such that the ends of said clip are inserted and anchored beyond said inner surface of said mating surface at said parallel slots, therein leaving said another of said arc-shaped sections in the middle of said clip arcing away from said mating surface.

11. The method defined in claim 10 wherein the arc-shaped end sections are inserted at the same time, such that said step of inserting is accomplished in a single motion.

* * * * *